United States Patent [19]

Meyer et al.

[11] Patent Number: 4,625,168

[45] Date of Patent: Nov. 25, 1986

[54] PHANTOM FOR NMR APPARATUS

[75] Inventors: Albertus C. Meyer; Hans H. Tuithof; Jacobus Mulder, all of Eindhoven, Netherlands

[73] Assignee: U.S. Philips Corporation, New York, N.Y.

[21] Appl. No.: 635,672

[22] Filed: Jul. 30, 1984

[30] Foreign Application Priority Data

Aug. 1, 1983 [NL] Netherlands .......................... 8302721

[51] Int. Cl.$^4$ ............................................ G01R 33/20
[52] U.S. Cl. ...................................... 324/300; 324/318
[58] Field of Search ............... 324/300, 307, 308, 309, 324/318, 319, 320, 322

[56] References Cited

U.S. PATENT DOCUMENTS

| 4,422,042 | 12/1983 | Sugimoto | 324/319 |
| 4,528,510 | 7/1985 | Loeffler | 324/308 |
| 4,551,678 | 11/1985 | Morgan | 324/300 |

Primary Examiner—Michael J. Tokar
Attorney, Agent, or Firm—Robert T. Mayer; Algy Tamoshunas

[57] ABSTRACT

A phantom for NMR apparatus comprises a structure of holes which are to be filled with a contrast medium so that when the phantom is imaged in NMR apparatus, imaging qualities such as resolution, sensitivity, linearity etc. can be read directly or measurements can be performed for this purpose.

12 Claims, 7 Drawing Figures

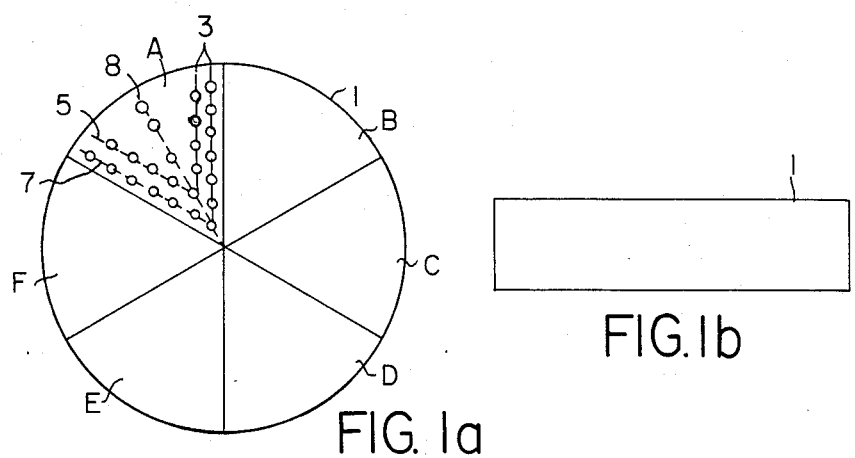
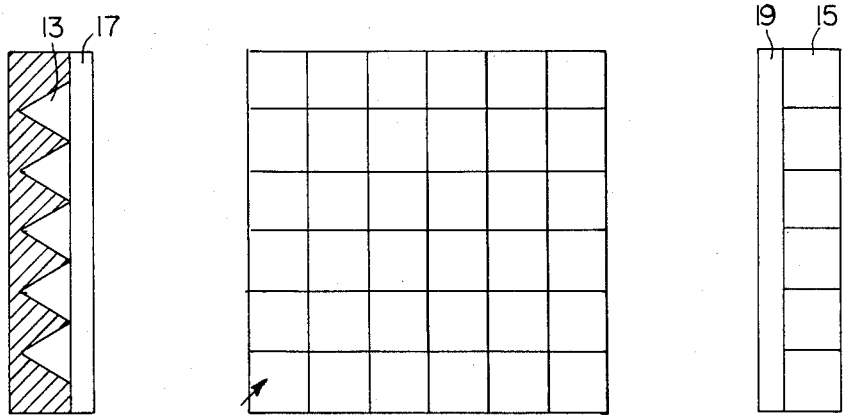
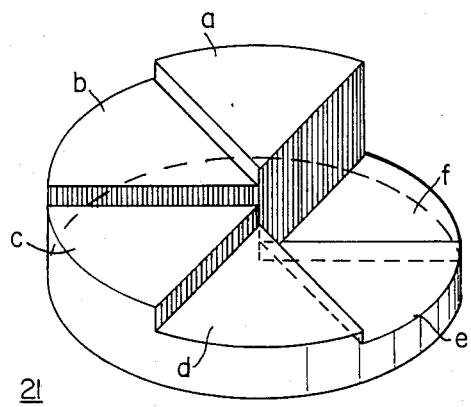

4,625,168

PHANTOM FOR NMR APPARATUS

BACKGROUND OF THE INVENTION

The invention relates to a phantom for NMR imaging apparatus, comprising a plastic body which is provided with holes which are to be filled with a contrast medium for NMR measurements.

A phantom of this kind is known from a book Nuclear Magnetic Resonance imaging, edited by Partain e,o, by N.J. Sneiders et al, pages 436–445, Nr. 33, "Phantoms for NMR image analysis".

A phantom described therein is made of plexiglass and is provided with a plurality of holes of various diameters, some holes of the same diameter being arranged in a corresponding row at a uniform distance from one another which equals the diameter of the hole. The holes may be filled with water, with a suitable additive or with another so-called contrast medium such as vaseline.

A phantom of this kind is not optimally suited to the derivation of image information, notably concerning spatial resolution, direction-dependent imaging quality, linearity of the image and the like.

SUMMARY OF THE INVENTION

It is an object of the invenrion to mitigate these drawbacks. To achieve this, a phantom of the described kind in accordance with the invention is characterized in that the shape, the size and the mutual orientation of the holes or cavities exhibit a structure which is adapted to those imaging property qualities of the apparatus which are to be measured.

When such a phantom is used for measuring the imaging qualities of the apparatus, information as regards the spatial resolution, the linearity of the image, the sensitivity etc. can be obtained in a direct manner.

A preferred embodiment of the phantom comprises a cylindrical body of, for example, plastic which is divided into several, for example from 6 to 12 segments, in each of which there are provided at least a few series of holes or cavities which are situated along radial lines. The holes are preferably situated at a distance from one another which, as before, equals the transverse dimension of the hole in the line direction and their size, differs from one segment to another. When such a phantom is used, the spatial resolution of the apparatus can be read directly from the image of the phantom. By rotating the phantom about the cylinder axis, the homogeneity of the resolution can also be checked.

A further preferred embodiment of the phantom comprises a plastic body in which there is formed a mutually orthogonal system of grooves which are to be filled with a contrast medium. Such a phantom is preferably shaped as a square cylinder and is notably suitable for the measurement of linearity in the image of the apparatus. Nonlinearity in the apparatus can be caused, for example by inhomogeneities in the magnetic field. The magnitude and the direction thereof can be calculated from the image of this phantom, after which appropriate corrections can be made. A phantom also can be constructed by putting a number of tubes (for example of glass) filled with a liquid with different values for $T_1$ and $T_2$ into a vessel with a liquid adapted to the apparatus and the liquids in the tube.

A phantom which is particularly suitable for checking apparatus suitable for the simultaneous or quasisimultaneous measurement of several slices of an object comprises, for example a number of planar spaces which is adapted to the number of slices to be simultaneously measured and which are separated by discs of plastic. The discs may then be consecutively numbered.

BRIEF DESCRIPTION OF THE DRAWINGS

Some preferred embodiments in accordance with the invention will be described in detail hereinafter with reference to the drawing wherein:

FIGS. 1a and 1b show a phantom which is divided into segments and which is notably suitable for the measurement of spatial resolution, FIGS. 2a-2c show a phantom which comprises an orthogonal system of grooves which are to be filled with a contrast medium for the measurement of imaging linearity;

FIG. 3 shows a phantom for sensitivity measurements, and

DESCRIPTION OF THE PREFERRED EMBODIMENTS

Figure 4:
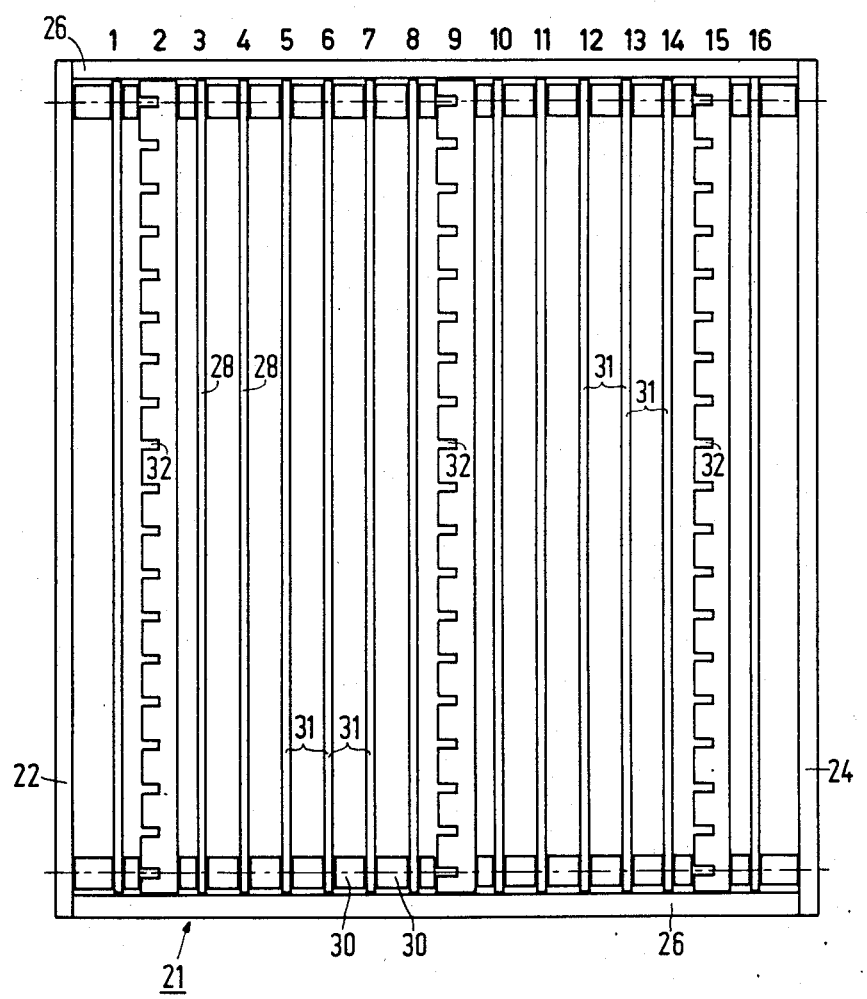
FIG. 4 shows a phantom for multi-slice measurements.

As shown in FIG. 1, a phantom in accordance with the invention which is particularly suitable for the measurement of spatial linearity of the image comprises a cylinder 1 which is made of plastic and which, in this case, is round. The structure of the phantom is preferably chosen so that interference with a line pattern in the display system is avoided; consequently, preferably 6 or 12 segments are chosen. The Figure shows a division into six sectors or segments A–F. In each of the segments there is provided a regular pattern of holes 3 which are arranged at least partly along straight lines. These holes may be filled with a high-contrast medium for NMR measurements, for example aqueous solutions, vaseline, etc. The holes in a first segment A are respectively arranged along the directions of the lines, for example at a distance of 6 mm from one another. The transverse dimensions of the holes, measured along the line, are preferably equal to the spacing between two successive holes. Each of the other segments is provided with holes which have the same size for that segment and also the same spacing, for example in the sequence 4, 3, 3, 1½ and 1 mm. Also feasible is a spacing sequence which increases by a factor $\sqrt{2}$ from one segment to another. The phantom as a whole has, for example, a diameter of 20 cm for head measurement apparatus and a diameter of 40 cm for body measurement apparatus, its thickness being, for example from 5 to 10 cm. In a preferred embodiment, the block is composed of exchangeable segments so that the range of spatial frequencies represented by the holes can be varied by the exchange of one or more segments, for example, by the replacement of the 6 mm segment by, for example, a 0.6 mm segment. The supporting material of the phantom is preferably a plastic which produces an extremely small NMR signal in comparison with the filler material in the holes, for example, because of the very short relaxation times for the spin resonances therein. Some comparatively large holes 8 are preferably provided for positioning the phantom with respect to an object slice to be measured. One of these holes preferably extends from a first end face of the phantom to approximately half the axial height thereof, a second hole extending from an opposite end face again to half the axial height.

A phantom as shown in FIG. 2 is particularly suitable for the measurement of spatial linearity. This phantom is also made of plastic and comprises an orthogonal system 11 of mutually perpendicular grooves 13 and 15 to be filled with a contrast medium with a pitch of, for example 20 grooves across the entire phantom for both groove systems, which phantom is for both directions 200 or 400 mm across. Using such a phantom, inhomogeneities, or in other words undesirable gradients, can be directly demonstrated in the (quasi-) steady magnetic field in the measurement space. Exact positioning of the phantom can also be achieved. The phantom further comprises a first cover plate 17 for the first groove grid comprising, viewed in the drawing, horizontal grooves 13, an optional intermediate plate, not shown in the drawing, the second groove grid with the grooves 15 which preferably extend transversely with respect to the grooves 13, and a second cover plate 19. The assembly formed by cover plates, grooves, grids and intermediate plates may also form one integral unit to which seals for sealing the end openings of the grooves are added. The grooves may alternatively have a different geometry, for example they may be rectangular or semicircular.

FIG. 3 shows a phantom which is particularly suitable for sensitivity measurements. A body 21 is again divided into segments which differ only as regards thickness, for example 12 segments with a thickness difference for each step of approximately 8%. The Figure shows a phantom comprising 6 segments A–F. Each segment is filled with or consists of a material which produces a resonance signal which can be suitably measured. Measurements performed on such a phantom provide a direct insight into the system linearity. A particular embodiment of this phantom has only two segments, each of which forms a semicircle, the thickness difference being, for example approximately 1 mm. The response of the apparatus to a step function can be measured by means of this phantom.

Different properties of each of the described phantoms can also be combined in one phantom. For example, a phantom can be constructed so as to comprise a radial arrangement of, for example 12 rows of holes whose diameter decreases in the direction of the centre of the phantom, for example in the sequence 20, 12, 8, 5, 3, 2, 1½ and 1 mm. The holes in the twelve successive radial lines have a correspondingly different depth, for example in a sequence in which the depth increases from 0.50 to 3.25 mm in steps of 0.25 mm.

A further embodiment of a combined phantom is a phantom which is suitable for measurements in apparatus for the simulatneous or at least quasi-simultaneous measurement of several slices. Such a phantom is shown in FIG. 4 and comprises two cover plates 22 and 24 and an envelope 26 which is, for example, cylindrical. A housing thus formed in this case comprises sixteen discs 28 of plastic which are stacked between spacers or rings 30, thus forming 16 sections 31. The second, the ninth and the fifteenth sections are constructed in the same manner as the phantom described with reference to FIG. 2, so that each of those sections has an orthogonal system of grooves 32. Each of the discs or sections is provided with a, preferably sequential, identification number, so that the orientation and position of a slice in the object can be read directly. For example, the numbers can be milled into the discs 38 so that it can be readily recognized in an image. The discs 28 have a thickness of, for example 2 mm, each section having a thickness of, for example 8 mm. The diameter of the phantom can again be chosen so as to be, for example 200 or 400 mm.

What is claimed is:

1. A phantom for NMR imaging apparatus comprising a cylindrical, plastic block having a circular cross section divided into a plurality of sectors, each sector having a pattern comprised of a plurality of axially extending cavities adapted to be filled with a contrast medium for NMR measurements, the cavities in each sector having cross section dimensions and spacing which are different from the cross section dimensions and spacing of the cavities in the other sectors.

2. A phantom as claimed in claim 1 wherein said pattern of each sector includes a sequence of said cavities spaced along a straight line extending from the periphery towards the center of said block.

3. A phantom as claimed in claims 1 or 2 wherein said cavities of a given sector are of a substantially equal size and are spaced from each other by a substantially equal distance.

4. A phantom as claimed in claim 2 wherein said cavities of said sequence have a circular cross section and a diameter which is substantially equal to the spacing between two successive cavities along said line.

5. A phantom for NMR imaging apparatus comprising a plastic block having a first plurality of elongated, generally parallel grooves formed in said block and a second plurality of elongated, generally parallel grooves formed in said block and extending in a direction which is perpendicular to the longitudinal direction of said grooves of said first plurality, and means for sealing a contrast liquid for NMR measurement in said grooves.

6. A phantom as claimed in claim 5, wherein said block is rectangular and wherein said grooves of said first and second plurality are each parallel to a respective one of two adjacent sides of said rectangular block.

7. A phantom for NMR imaging apparatus comprising a body of a material which produces a measurable nuclear magnetic resonance signal when excited by a magnetic field, said body being divided into a plurality of segments each having a thickness which is different from the thickness of the other segments for measuring linearity of the NMR imaging apparatus.

8. A phantom as claimed in claim 7 wherein said body is a cylinder having a circular cross section and said segments are defined by sectors which have different thicknesses in the axial direction.

9. A phantom as claimed in claim 7, wherein the thickness of said segments varies in accordance with an arithmetical progression.

10. A phantom for NMR imaging apparatus comprising a body divided into a plurality of sections representing slices of an object to be examined by said apparatus and means for uniquely identifying each of said sections so that the orientation and position of a given section can be determined from the NMR image of the phantom produced by said apparatus.

11. A phantom as claimed in claim 10 wherein said body is a hollow cylinder and comprising a plurality of axially spaced discs defining said sections therebetween.

12. A phantom as claimed in claim 11 wherein said discs are spaced from each other by a substantially equal distance.

* * * * *